(12) United States Patent
Sakai et al.

(10) Patent No.: US 12,177,973 B2
(45) Date of Patent: *Dec. 24, 2024

(54) PRINTED WIRING BOARD

(71) Applicants: SUMITOMO ELECTRIC INDUSTRIES, LTD., Osaka (JP); SUMITOMO ELECTRIC PRINTED CIRCUITS, INC., Koka (JP)

(72) Inventors: Shoichiro Sakai, Osaka (JP); Junichi Motomura, Osaka (JP); Koji Nitta, Osaka (JP); Masashi Iwamoto, Koka (JP); Mitsutaka Tsubokura, Osaka (JP); Mari Sogabe, Osaka (JP); Akira Tsuchiko, Osaka (JP)

(73) Assignees: SUMITOMO ELECTRIC INDUSTRIES, LTD., Osaka (JP); SUMITOMO ELECTRIC PRINTED CIRCUITS, INC., Koka (JP)

( * ) Notice: Subject to any disclaimer, the term of this patent is extended or adjusted under 35 U.S.C. 154(b) by 182 days.

This patent is subject to a terminal disclaimer.

(21) Appl. No.: 17/922,872

(22) PCT Filed: May 20, 2020

(86) PCT No.: PCT/JP2020/020002
§ 371 (c)(1),
(2) Date: Nov. 2, 2022

(87) PCT Pub. No.: WO2021/234875
PCT Pub. Date: Nov. 25, 2021

(65) Prior Publication Data
US 2023/0164926 A1    May 25, 2023

(51) Int. Cl.
*H05K 1/09* (2006.01)
*H05K 1/11* (2006.01)

(52) U.S. Cl.
CPC ............... *H05K 1/09* (2013.01); *H05K 1/115* (2013.01); *H05K 2201/0355* (2013.01); *H05K 2201/09509* (2013.01)

(58) Field of Classification Search
CPC ............. H05K 1/09; H05K 1/115; H05K 2201/0355; H05K 2201/09509; H05K 3/427; C23C 18/1653; C23C 18/38
See application file for complete search history.

(56) References Cited

U.S. PATENT DOCUMENTS 10,076,044 B2 * 9/2018 Yoshida ............... H05K 3/423
11,877,397 B2 * 1/2024 Motomura ........... C23C 18/1844

FOREIGN PATENT DOCUMENTS

JP    H10-233579 A    9/1998
JP    2000-252622 A   9/2000
(Continued)

OTHER PUBLICATIONS

Jul. 28, 2020 International Search Report issued in International Patent Application No. PCT/JP2020/019432.
(Continued)

*Primary Examiner* — James Wu
(74) *Attorney, Agent, or Firm* — Oliff PLC

(57) ABSTRACT

A printed wiring board includes a base layer having insulating properties, a first conductive layer directly or indirectly stacked on the base layer front surface, and including a copper foil, a second conductive layer directly or indirectly stacked on the base layer back surface, and including a copper foil, a stacked body for a via hole, the stacked body being stacked on an inner periphery and a bottom of a connection hole that extends through the first conductive layer and the base layer in a thickness direction, and being configured to electrically connect the first conductive layer and the second conductive layer to each other, and having an electroless copper plating layer. Each copper foil contains a (Continued)

copper crystal grain oriented in a plane orientation, and an average crystal grain size of copper of each copper foil is 10 μm or greater, the electroless copper plating layer includes palladium.

5 Claims, 1 Drawing Sheet

(56) References Cited

FOREIGN PATENT DOCUMENTS

| | | |
|---|---|---|
| JP | 2003-209330 A | 7/2003 |
| JP | 2004-214410 A | 7/2004 |
| JP | 2009-071132 A | 4/2009 |
| WO | 2008/050584 A1 | 5/2008 |

OTHER PUBLICATIONS

Oct. 4, 2023 Notice of Allowance issued in U.S. Appl. No. 17/605,939.

\* cited by examiner

PRINTED WIRING BOARD

TECHNICAL FIELD

The present disclosure relates to a printed wiring board.

BACKGROUND ART

In recent years, miniaturization of electronic devices has progressed, and high-density wiring of printed wiring boards used in electronic devices has been required. To meet this demand, a multi-layer printed wiring board having a plurality of patterned conductive layers has been widely used. In the multilayer printed wiring board, in order to connect patterns of different conductive layers, for example, a via hole penetrating a base layer in which metal foil is stacked as a conductive layer on a front surface side and a back surface side is provided. In the via hole, an electroless copper plating layer and an electrolytic copper plating layer are formed on an inner circumferential surface of a hole penetrating the base layer. (See Japanese Unexamined Patent Application Publication No. 2004-214410).

PRIOR ART DOCUMENT

Patent Literature

[PTL 1] Japanese Unexamined Patent Application Publication No. 2004-214410

SUMMARY OF THE INVENTION

A printed wiring board according to the present disclosure includes a base layer having insulating properties, a first conductive layer directly or indirectly stacked on a front surface of the base layer, and including a copper foil, a second conductive layer directly or indirectly stacked on a back surface of the base layer, and including a copper foil, and a stacked body for a via hole, the stacked body being stacked on an inner periphery and a bottom of a connection hole that extends through the first conductive layer and the base layer in a thickness direction, and being configured to electrically connect the first conductive layer and the second conductive layer to each other. The stacked body for the via hole has an electroless copper plating layer that is stacked on the inner periphery and the bottom of the connection hole, and an electrolytic copper plating layer that is stacked on a surface of the electroless copper plating layer. Each copper foil contains a copper crystal grain oriented in a (100) plane orientation, and an average crystal grain size of copper of each copper foil is 10 μm or greater. The electroless copper plating layer includes palladium. A stacking amount of the palladium per unit area of a surface of each copper foil is 0.03 μg/cm² to 0.15 μg/cm².

DETAILED DESCRIPTION OF THE PREFERRED EMBODIMENTS

Figure 1:
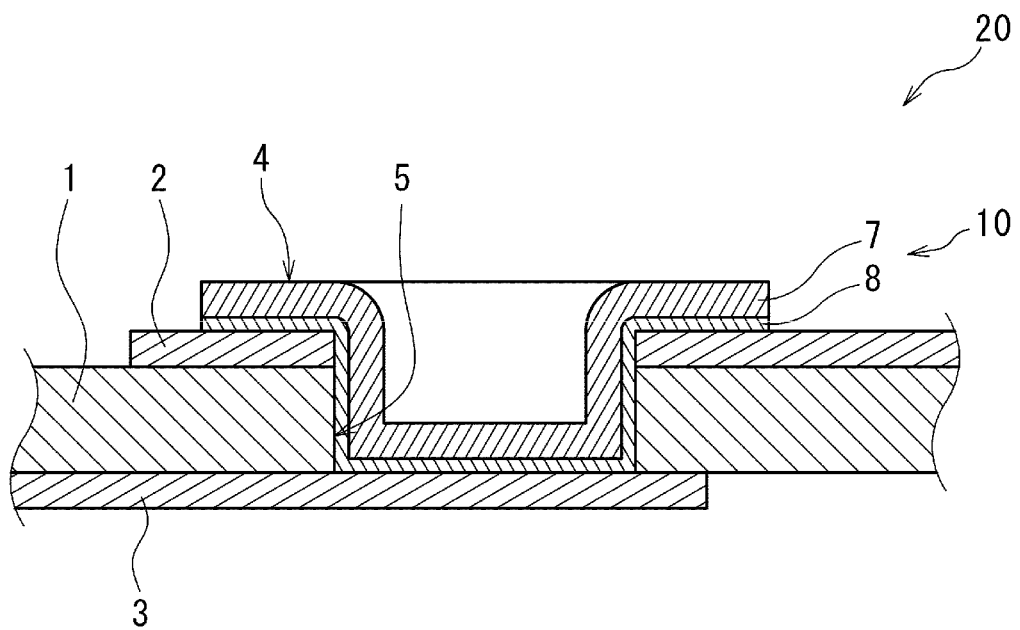
FIG. 1 is a schematic cross-sectional view illustrating a printed wiring board according to an embodiment.

Problems to be Solved by the Present Disclosure

In general, copper foil is widely used as a wiring layer for the via hole, and further improvement in mechanical characteristics such as flexibility is required for the copper foil. For example, in copper foil, in order to improve the mechanical properties, the crystal orientation, crystal grain size, and the like of copper have been studied. However, when copper electroplating is performed after electroless copper plating is performed on the surface of copper foil having a crystal orientation and a crystal grain size in a specific range, copper crystals of the electrolytic copper plating layer may partially abnormally grow. When the crystal of copper is partially abnormally grown as described above, unevenness is generated on the surface of the electrolytic copper plating layer, and thus, there is a case where it is erroneously detected as a defect in an appearance inspection by an automated optical inspection system (AOI). In addition, since a large amount of copper is deposited on the convex portions formed on the surface of the electrolytic copper plating layer, copper is not sufficiently deposited on the bottom portion of the via hole, and as a result, the bottom portion of the via hole may be peeled off from the conductive layer.

The present disclosure has been made in view of the above-described circumstances, and an object thereof is to provide a printed wiring board capable of suppressing erroneous detection in appearance inspection by an automated optical inspection system and peeling of a bottom portion of a via hole.

[Effects of the Present Disclosure]

Advantageous effects of invention according to the present disclosure, it is possible to provide a printed wiring board capable of suppressing erroneous detection in an appearance inspection and peeling of a bottom portion of a via hole.

DESCRIPTION OF EMBODIMENTS OF THE PRESENT DISCLOSURE

First, embodiments of the present disclosure will be listed and described.

A printed wiring board according to the present disclosure includes a base layer having insulating properties, a first conductive layer directly or indirectly stacked on a front surface of the base layer, and including a copper foil, a second conductive layer directly or indirectly stacked on a back surface of the base layer, and including a copper foil, and a stacked body for a via hole, the stacked body being stacked on an inner periphery and a bottom of a connection hole that extends through the first conductive layer and the base layer in a thickness direction, and being configured to electrically connect the first conductive layer and the second conductive layer to each other. The stacked body for the via hole has an electroless copper plating layer that is stacked on the inner periphery and the bottom of the connection hole, and an electrolytic copper plating layer that is stacked on a surface of the electroless copper plating layer. Each copper foil contains a copper crystal grain oriented in a (100) plane orientation, and an average crystal grain size of copper of each copper foil is 10 μm or greater. The electroless copper plating layer includes palladium. A stacking amount of the palladium per unit area of a surface of each copper foil is 0.03 μg/cm² to 0.15 μg/cm².

Copper foil stacked on a front surface of a base layer of a printed wiring board contains copper crystal grains oriented in a (100) plane orientation, and an average crystal grain size of the copper is 10 μm or greater. In this case, the orientation of the copper crystal grains of the copper foil is easily taken over by the copper crystal grains deposited by electroless copper plating and the copper crystal grains deposited by electrolytic copper plating. As a result, an electroless copper plating layer and an electrolytic copper plating layer having the same orientation as the copper crystal grains of the copper foil are formed. Then, there is a possibility that the crystal of copper in the electrolytic copper plating layer is partially abnormally grown to cause unevenness on the surface of the electrolytic copper plating layer. In the printed wiring board, since the electroless copper plating layer contains palladium particularly in the vicinity of the interface with the underlying conductive layer, the orientation of the copper crystal grains of the copper foil is suppressed from being taken over by the copper crystal grains deposited by electroless copper plating. As a result, the formation of unevenness on the surface of the electrolytic copper plating layer due to abnormal growth of copper crystals in the electrolytic copper plating layer is suppressed. Therefore, the printed wiring board can suppress erroneous detection in appearance inspection by an automated optical inspection system and peeling of the bottom portion of the via hole. In addition, in the printed wiring board, when the stacking amount of palladium per unit area of the surface of copper foil is 0.03 $\mu g/cm^2$ to 0.15 $\mu g/cm^2$, the amount of catalytic nuclei generated by electroless copper plating is increased, and the growth of plating having a different orientation from that of copper crystal grains of copper foil is promoted. As a result, an effect of suppressing the formation of the electroless copper plating layer having the same orientation as that of copper crystal grains of the copper foil can be increased. Therefore, it is possible to improve the effect of suppressing the erroneous detection in the appearance inspection by the automated optical inspection system and the peeling of the bottom portion of the via hole. The form of the palladium-containing catalyst of the present invention is an aqueous solution containing palladium ions, and does not include a colloid type solution such as a tin-palladium solution. Therefore, in the printed wiring board of the present disclosure, the electroless copper plating layer does not contain tin.

Here, the "crystal grain size" refers to, for example, a crystal orientation analysis of a surface of a copper foil as a sample by an electron backscatter diffraction (EBSD) method to detect a crystal grain boundary, a region surrounded by the crystal grain boundary is defined as a crystal grain, and a diameter of a circle having the same area as an area of the region is defined as an crystal grain size of each crystal grain. The term "average crystal grain size" refers to an average value of crystal grain sizes of crystal grains existing in a predetermined measurement visual field. In addition, the plane orientation of the crystal grains of copper of the copper foil is calculated by measuring positions of the surface of the copper foil randomly extracted using EBSD method a plurality of times. The "average thickness" refers to an average value of thicknesses measured at arbitrary 10 points.

In the printed wiring board, it is preferable that a proportion of an area of copper crystal grains oriented in a (100) plane orientation present in the surface of copper foil with respect to an area of the surface of copper foil is 50% or greater. When the proportion of the area of the copper crystal grains oriented in the (100) plane orientation existing in the surface of copper foil with respect to the area of the surface of copper foil is 50% or greater, the effect of suppressing the partial abnormal growth of the copper crystal of the electrolytic copper plating layer is improved.

Here, the "proportion of the area of the copper crystal grains oriented in the (100) plane orientation" refers to the proportion of the area of the region of the copper crystal grains oriented in the (100) plane orientation with respect to the area of the entire surface of copper foil.

The stacking amount of palladium per unit area of the surface of copper foil is preferably 0.05 $\mu g/cm^2$ or greater and 0.10 $\mu g/cm^2$ or less. When the stacking amount of palladium is in the above range, the amount of catalyst nuclei generated by electroless copper plating is in an appropriate range. As a result, it is considered that an electroless copper plating layer and an electrolytic copper plating layer having the same orientation as the copper crystal grains of the copper foil are less likely to be formed.

The proportion of an area of copper crystal grains oriented in a (100) plane orientation existing in the surface of copper foil with respect to an area of the surface of copper foil is preferably 60% or greater. When the proportion of the area of the copper crystal grains oriented in the (100) plane orientation existing in the surface of copper foil is in the above range, the effect of suppressing the partial abnormal growth of the crystal of copper in the electrolytic copper plating layer is improved.

The electroless copper plating layer may have an average thickness of 0.01 μm to 1.0 μm. When the average thickness of the electroless copper plating layer is in the above range, the electrolytic copper plating layer can be uniformly formed, and the orientation of the copper crystal grains of the copper foil can be prevented from being taken over by the copper crystal grains deposited by electroless copper plating.

Details of Embodiments of the Present Disclosure

Hereinafter, embodiments of a printed wiring board according to the present disclosure will be described in detail with reference to the drawings.

<Printed Wiring Board>

FIG. 1 illustrates a printed wiring board according to an embodiment of the present disclosure. A printed wiring board 20 includes a base layer 1 having insulating properties, a first conductive layer 2 directly or indirectly stacked on a front surface of base layer 1 and including copper foil, a second conductive layer 3 directly or indirectly stacked on a back surface of base layer 1 and including copper foil, and a stacked body for via hole 10 stacked on an inner periphery and a bottom of a connection hole 5 that extends through first conductive layer 2 and base layer 1 in a thickness direction and being configured to electrically connecting first conductive layer 2 and second conductive layer 3 each other. A via hole 4 for connecting between patterns of different conductive layers is formed by stacking stacked body for via hole 10 on connection hole 5.

Hereinafter, each component of the printed wiring board will be described in detail.

[Base Layer]

Examples of the material of base layer 1 include polyamide, polyimide, polyamideimide, and polyester, for example. Among them, polyamide, polyimide, and polyamideimide are preferably used in terms of mechanical strength such as heat resistance. The printed wiring board does not necessarily have to be flexible.

The lower limit of the average thickness of base layer 1 is preferably 5 μm, and more preferably 10 μm. On the other hand, the upper limit of the average thickness of base layer 1 is preferably 100 μm, and more preferably 50 μm. When the average thickness of base layer 1 is less than the lower limit, the strength of base layer 1 may be insufficient. On the other hand, when the average thickness of base layer 1 exceeds the upper limit, the flexibility may be insufficient.

[Conductive Layer]

First conductive layer 2 and second conductive layer 3 is formed by patterning copper foil stacked on base layer 1. The copper foil contains copper crystal grains oriented in a (100) plane orientation, and an average crystal grain size of copper of the copper foil is 10 μm or greater. When the plane orientation and the average crystal grain size of the copper crystal grains of the copper foil are in the above ranges, mechanical properties such as flexibility are excellent.

Usually, the patterning of the conductors forming first conductive layer 2 and second conductive layer 3 is performed after forming via holes 4. In order to improve the wiring density, each of first conductive layer 2 and second conductive layer 3 may have a land to which via hole 4 is connected, and a wiring pattern having a width smaller than that of the land and extending linearly.

The copper foil contains copper crystal grains oriented in the (100) plane orientation. The lower limit of the average crystal grain size of copper of the copper foil is 10 μm, and preferably 12 μm. The upper limit of the average crystal grain size of copper of the copper foil is not particularly limited, but may be, for example, 100 μm, preferably 80 μm, and more preferably 55 μm. In addition, when the average crystal grain size of copper of the copper foil is less than 10 μm, it is difficult to generate an appearance defect on the surface of the electrolytic copper plating layer, and thus the effect of the printed wiring board cannot be sufficiently exhibited.

In the printed wiring board, the lower limit of the proportion of the area of the copper crystal grains oriented in the (100) plane orientation existing in the surface of copper foil with respect to the area of the surface of copper foil is preferably 50%, more preferably 60%, and still more preferably 80%. When the proportion of the area of the copper crystal grains existing in the surface of copper foil and oriented in the (100) plane orientation with respect to the area of the surface of copper foil is in the above range, the effect of suppressing the partial abnormal growth of the copper crystals of the electrolytic copper plating layer is improved. When proportion of the area is less than 40%, it is difficult to cause the appearance detect of the surface of the electrolytic copper plating layer, and thus the effect of the printed wiring board cannot be sufficiently exhibited.

The proportion of the area of the copper crystal grains oriented in the (100) plane orientation existing in the surface of copper foil with respect to the area of the surface of copper foil may be controlled in a predetermined range by, for example, controlling the element content, controlling the rolling conditions, or performing a heat treatment, although not particularly limited thereto.

The lower limit of the average thickness of first conductive layer 2 and second conductive layer 3 is preferably 2 μm, and more preferably 5 μm from the viewpoint of ensuring sufficient conductivity. On the other hand, the upper limit of the average thickness of first conductive layer 2 and second conductive layer 3 is preferably 100 μm, and more preferably 50 μm from the viewpoint of circuit formability.

[Stacked Body for Via Hole]

Stacked body for via hole 10 includes an electroless copper plating layer 8 stacked on an inner periphery and a bottom of connection hole 5, and an electrolytic copper plating layer 7 stacked on a surface of electroless copper plating layer 8. Stacked body for via hole 10 is stacked on an inner periphery and a bottom of connection hole 5 that extends through first conductive layer 2 and base layer 1 in a thickness direction. Stacked body for via hole 10 electrically connects between first conductive layer 2 and second conductive layer 3. More specifically, stacked body for via hole 10 include electroless copper plating layer 8 stacked on an inner periphery of connection hole 5, a surface of first conductive layer 2 opposite to base layer 1, and a surface of second conductive layer 3 (i.e., bottom portion) exposed to the inside of connection hole 5, and electrolytic copper plating layer 7 further stacked on electroless copper plating layer 8.

Figure 2:
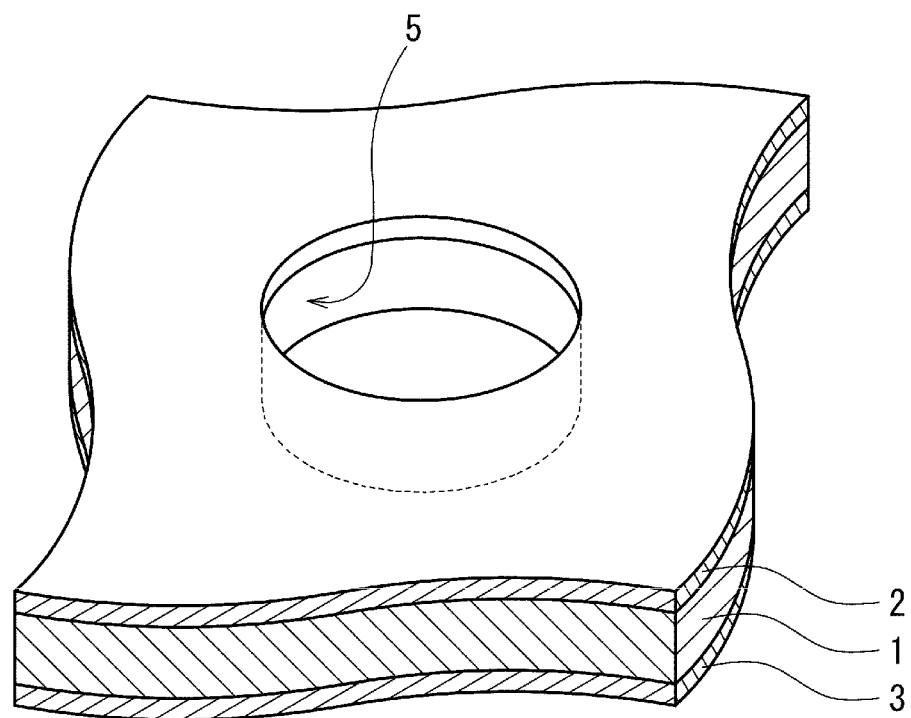
FIG. 2 is a schematic perspective view of a connection hole of the printed wiring board of FIG. 1.

FIG. 2 illustrates a state before forming via hole 4 and patterning first conductive layer 2 and second conductive layer 3 in order to show the shape of connection hole 5. Connection hole 5 extends through base layer 1 and first conductive layer 2 in the thickness direction, and is defined by a cylindrical surface forming connection hole 5. Then, stacked body for via hole 10 is stacked on connection hole 5 to form via hole 4 for connecting the patterns of first conductive layer 2 and the second conductive layer each other.

(Electroless Copper Plating Layer)

Electroless copper plating layer 8 is a thin layer having conductivity, and is used as an adherend when electrolytic copper plating layer 7 is formed by electrolytic copper plating. Electroless copper plating layer 8 may be formed of copper stacked by electroless copper plating. Copper plating is suitable for printed wiring boards because of its flexibility, ability to form thick films, good adhesion to electrolytic copper plating, and high conductivity. This electroless copper plating is a treatment for depositing a metal having catalytic activity by the reduction action of a catalyst, and may be performed by applying various commercially available electroless copper plating solutions. By using the electroless copper plating as described above, the stack of electroless copper plating layer 8 can be easily performed, and the stack of electrolytic copper plating layer 7 can be reliably performed.

The lower limit of the average thickness of electroless copper plating layer 8 is preferably 0.05 μm, and more preferably 0.10 μm. On the other hand, the upper limit of the average thickness of electroless copper plating layer 8 is preferably 1.0 μm, and more preferably 0.5 μm. When the average thickness of electroless copper plating layer 8 is less than the lower limit, the continuity of electroless copper plating layer 8 cannot be ensured, and electrolytic copper plating layer 7 may not be uniformly formed. In addition, in a case where the average thickness is less than the lower limit, there is a possibility that the orientation of the copper crystal grains of the copper foil is easily taken over by the copper crystal grains deposited by electroless copper plating. On the other hand, when the average thickness of electroless copper plating layer 8 exceeds the upper limit, the cost may be unnecessarily increased. When the average thickness of the electroless copper plating layer is in the above range, the electrolytic copper plating layer can be uniformly formed, and the orientation of the copper crystal grains of the copper foil can be prevented from being taken over by the copper crystal grains deposited by electroless copper plating.

Electroless copper plating layer 8 contains palladium as a catalyst. Palladium is applied as a catalyst prior to the electroless copper plating layer stacking step described below, and an electroless copper plating layer is stacked thereon. Therefore, palladium exists at a high content in the electroless copper plating layer near the interface with the conductive layer. In printed wiring board 20, since electroless copper plating layer 8 contains palladium, the orientation of the copper crystal grains of the copper foil is suppressed from being taken over by the copper crystal grains deposited by electroless copper plating. As a result, the formation of unevenness on the surface of electrolytic copper plating layer 7 due to abnormal growth of copper crystals of electrolytic copper plating layer 7 is suppressed. Therefore, printed wiring board 20 can suppress erroneous detection in the appearance inspection by an automated optical inspection system and peeling of the bottom portion of via hole 4 from second conductive layer 3. As described above, the form of the palladium-containing catalyst of the present application includes an aqueous solution containing palladium ions, and water is used as a solvent.

The lower limit of the stacking amount of palladium per unit area of the surface of copper foil is 0.03 µg/cm$^2$, preferably 0.05 µg/cm$^2$. The upper limit of the stacking amount of palladium is 0.15 µg/cm$^2$, preferably 0.10 µg/cm$^2$. When the stacking amount of palladium is in the above range, the amount of catalyst nuclei generated by electroless copper plating is in an appropriate range. As a result, it is considered that electroless copper plating layer 8 and electrolytic copper plating layer 7 having the same orientation as the copper crystal grains of the copper foil are less likely to be formed. When the stacking amount of the palladium exceeds the upper limit, the connection strength between the copper foil included in second conductive layer 3 and electroless copper plating layer 8 and electrolytic copper plating layer 7 at the bottom of via hole 4 is weakened, and the bottom of via hole 4 may be peeled off.

(Electrolytic Copper Plating Layer)

Electrolytic copper plating layer 7 is stacked on the surface of electroless copper plating layer 8 by electrolytic copper plating. In this way, by forming electroless copper plating layer 8 and then providing electrolytic copper plating layer 7 on the inner periphery and the bottom of electroless copper plating layer 8, via hole 4 having excellent conductivity can be easily and reliably formed. As described above, since copper is inexpensive and has high conductivity, copper is suitably used as the metal forming the electrolytic copper plating layer.

The lower limit of the average thickness of electrolytic copper plating layer 7 is preferably 1 µm, and more preferably 5 µm. On the other hand, the upper limit of the average thickness of electrolytic copper plating layer 7 is preferably 50 µm, and more preferably 30 µm. When the average thickness of electrolytic copper plating layer 7 is less than the lower limit, via hole 4 may be broken due to bending or the like of printed wiring board 20, and the electrical connection between first conductive layer 2 and second conductive layer 3 may be broken. In addition, in a case where the average thickness is less than the lower limit, there is a possibility that the orientation of the copper crystal grains of the copper foil is easily taken over by the copper crystal grains deposited by electrolytic copper plating. On the other hand, when the average thickness of electrolytic copper plating layer 7 exceeds the upper limit, printed wiring board 20 may be excessively thick or the manufacturing cost may be unnecessarily increased.

[Method of Manufacturing Printed Wiring Board]

The method of manufacturing printed wiring board includes, for example, stacking a first conductive layer including copper foil on a front surface of a base layer and stacking a second conductive layer including copper foil on a back surface of the base layer, forming a connection hole extending through the first conductive layer and the base layer in a thickness direction, performing pretreatment before performing electroless copper plating on an inner periphery and a bottom of the connection hole, stacking an electroless copper plating layer on the inner periphery and the bottom of the connection hole, and stacking an electrolytic copper plating layer on a surface of the electroless copper plating layer.

(Step of Stacking Conductive Layer)

In stacking the conductive layer, the copper foil is stacked on the front surface of the base layer to form a first conductive layer. In addition, a second conductive layer is formed by stacking the copper foil on the back surface of the base layer. In stacking the conductive layer, a conductive pattern is formed on the front surface of the base layer by a known method.

Examples of the method of stacking the copper foil constituting the first conductive layer and the second conductive layer on the base layer include, but are not limited to, a bonding method in which copper foil is bonded with an adhesive, a casting method in which a resin composition as a material of the base layer is applied onto copper foil, a sputtering/plating method in which copper foil is formed by plating on a thin conductive layer (seed layer) having a thickness of several nanometers formed on the base layer by sputtering or vapor deposition, and a lamination method in which copper foil is bonded to the base layer by hot pressing.

(Step of Forming Connection Hole)

A method of forming a hole for electrically connecting the first conductive layer and the second conductive layer is not particularly limited, and for example, a method of opening a hole in the first conductive layer and the base layer using a microdrill or a laser to expose the copper foil of the second conductive layer may be used.

(Performing Pretreatment of Electroless Copper Plating)

In performing pretreatment of the electroless copper plating, pretreatment is performed before performing electroless copper plating on the inner periphery and the bottom of the connection hole. In this step, for example, a cleaner step, an acid treatment step, a pre-dipping step, a catalyst treatment step, a reduction step, and the like are performed.

The pre-dipping step is a step of dipping in a solution obtained by removing the catalyst from the catalyst solution before dipping in the catalyst solution. In the pre-dipping step, the water adhering to the surface of the conductive pattern is replaced so that the catalyst is easily adhered to the front surface of the base layer. Thus, it is possible to suppress the occurrence of variation in the dispersion state of the catalyst in the subsequent catalyst treatment step.

In the catalyst treatment step, a stack body including the base layer and the conductive layer is immersed in an activator containing palladium ions. After the catalyst treatment step, a water washing step is performed. As described above, the catalytic treatment process using palladium is performed after stacking the conductive layer and before stacking the electroless copper plating layer. Therefore, palladium exists at a high content near the interface in the electroless copper plating layer with the conductive layer.

In the reduction step, the catalyst is reduced. In particular, in the reduction step, palladium)(Pd$^0$) are formed on the surface as catalyst nuclei on reduction of palladium ions (Pd$^{2+}$), thus palladium catalyst is supported on the surface of the conductive pattern. After the reduction step, a water washing step is performed.

(Step of Stacking Electroless Copper Plating Layer)

In stacking the electroless copper plating layer, electroless copper plating is performed on the inner periphery and the bottom of the connection hole to form an electroless copper plating layer. In stacking the electroless copper plating layer, a stack body including the base layer and the conductive layer is immersed in an electroless copper plating solution in which a plating reaction is activated by heating to stack copper on the surface of the conductive pattern. The electroless copper plating solution is preferably an alkaline bath.

The lower limit of the heating temperature of the electroless copper plating solution is preferably 20° C. On the other hand, the upper limit of the heating temperature of the electroless copper plating solution is preferably 40° C. When the heating temperature of the electroless copper plating solution is less than the lower limit, the plating reaction may be insufficient. On the other hand, when the heating temperature of the electroless copper plating solution exceeds the upper limit, it may be difficult to control the thickness of the electroless copper plating layer to be formed.

The lower limit of the immersion time in the electroless copper plating solution is preferably 1 minute, and more preferably 2 minutes. On the other hand, the upper limit of the immersion time in the electroless copper plating solution is preferably 30 minutes, and more preferably 20 minutes. When the immersion time in the electroless copper plating solution is less than the lower limit, an electroless copper plating layer having a sufficient thickness may not be formed. On the other hand, when the immersion time in the electroless copper plating solution exceeds the above upper limit, there is a possibility that erosion of the conductive pattern due to local cell action cannot be sufficiently prevented.

(Step of Stacking Electrolytic Copper Plating Layer)

In stacking the electrolytic copper plating layer, an electrolytic copper plating layer is stacked on the surface of the electroless copper plating layer by electrolytic copper plating. In this electrolytic copper plating step, the thickness of the stacked body for via hole is increased to a desired thickness.

In stacking the electrolytic copper plating layer of forming the electrolytic copper plating layer, a metal is stacked by electrolytic copper plating using the electroless copper plating layer as an adherend to form the electrolytic copper plating layer in contact with the inner periphery and the bottom of the electroless copper plating layer, thereby forming a via hole having a sufficient thickness.

According to the printed wiring board, when a copper foil in which copper crystal grains are oriented in a (100) plane orientation and an average crystal grain size is 10 μm or greater is used for a conductive layer, the formation of unevenness on a surface of an electrolytic copper plating layer of a stacked body for a via hole is suppressed. Therefore, the printed wiring board can suppress erroneous detection in appearance inspection by an automated optical inspection system and peeling of the bottom portion of the via hole. Therefore, the printed wiring board can be particularly suitably used as a flexible printed wiring board used in small portable electronic devices and the like.

OTHER EMBODIMENTS

It should be understood that the embodiments disclosed herein are illustrative in all respects and are not restrictive. The scope of the present disclosure is not limited to the configurations of the above-described embodiments, but is defined by the claims, and is intended to include meanings equivalent to the claims and all modifications within the scope.

In the printed wiring board, the first conductive layer and the second conductive layer are relative, and a conductive layer serving as a first conductive layer in one via hole may serve as a second conductive layer in another via hole.

The printed wiring board may be a multi-layer wiring board in which additional base layers and conductive layers are stacked. In addition, the printed wiring board may include other layers such as a coverlay, a solder resist, and a shielding film. In the case where the printed wiring board is a multilayer wiring board, the via hole may be a via hole extending through multiple layers.

EXAMPLES

Hereinafter, the present disclosure will be described in detail based on examples, but the present disclosure is not construed to be limited based on the description of the Examples.

[No. 1 to No. 5]

As a base, ESPANEX (copper 12 μm/polyimide 12 μm/copper 12 μm) manufactured by Nippon Steel & Sumikin Chemical Co., Ltd. was used. Copper foil oriented in the (100) plane orientation was stacked on the front surface and the back surface of the base material to form conductive layers on the front surface and the back surface of the base material (stacking conductive layer). Copper and polyimide in the surface layer of the obtained sample were removed by a UV laser to form a via hole (connection hole forming step). Next, pretreatment of electroless copper plating was performed on substantially the entire surface of the conductive layer (performing pretreatment of electroless copper plating). In this electroless copper plating pretreatment step, the sample was immersed in an aqueous solution (activator) containing palladium ions as a catalytic treatment. The conditions of performing pretreatment of electroless copper plating of No. 1 to No. 5 were as follows.

(Conditions of Performing Pretreatment of Electroless Copper Plating)

The conditions of No. 4 and No. 5 were the same as those of No. 1.

(1) No. 1

Cleaner→soft etching (60 seconds)→acid pickling→pre-dipping→activators (palladium concentration in solution: 1.5 times, 0.12 g/L) electroless copper plating was performed.

(2) No. 2

Cleaner→soft etching (60 seconds)→acid pickling→pre-dipping→activators (normally palladium concentration: 0.08 g/L)→electroless copper plating was performed.

(3) No. 3

Cleaner→soft etching (60 seconds)→acid pickling→pre-dipping→activators (palladium concentration in solution: 3 times, 0.24 g/L) electroless copper plating was performed.

(4) No. 4

Cleaner→soft etching (60 seconds)→acid pickling→pre-dipping→activators (palladium concentration in solution: 1.5 times, 0.12 g/L) electroless copper plating was performed.

(5) No. 5

Cleaner→soft etching (60 seconds)→acid pickling→pre-dipping→activators (palladium concentration in solution: 1.5 times, 0.12 g/L) electroless copper plating was performed.

The electroless copper plating was performed at 23° C. for 15 minutes, and an electroless copper plating layer having an average thickness of 0.10 μm was stacked (step of stacking electroless copper plating layer). Subsequently, the current density was adjusted to $2 A/dm^2$ with respect to the exposed area of the conductive layer, and electrolytic copper plating was performed at 25° C. for 28 minutes. Then, an electrolytic copper plating layer having an average thickness of 12 μm was stacked (step of stacking electrolytic copper plating layer).

[Evaluation]
(Measurement of Stacking Amount of Palladium)
The stacking amount of palladium on the copper foil was measured by cutting out the printed wiring boards of No. 1 to No. 5 into 20 mm×20 mm, dissolving them in a mixed solution of nitric and hydrochloric acids, and then measuring the dissolved solution by inductively coupled plasma-mass spectrometry (ICP-MS).
(Degree of Erroneous Detection in Appearance Inspection by Automated Optical Inspection System)

One hundred printed wiring boards of each of No. 1 to No. 5 were prepared, and appearance inspection was performed on the plurality of printed wiring boards using an automated optical inspection system. Next, each of the printed wiring boards No. 1 to No. 5 in which an appearance defect was detected by the automated optical inspection system was visually inspected for the presence or absence of an accurate appearance defect with an optical microscope. The proportion of erroneous detection in the appearance inspection of each of the printed wiring boards No. 1 to No. 5 by the automated optical inspection system was calculated and evaluated in the following three grades, and the printed wiring boards evaluated as A and B were determined to be acceptable.

A: Erroneous detection rate 0% or greater and less than 6%
B: Erroneous detection rate 6% or greater and less than 16%
C: Erroneous detection rate of 16% or greater (Occurrence Rate of Peeling at Bottom Portion of Via Hole)

Peeling at the bottom of the via hole was visually inspected with an optical microscope. With respect to the occurrence rate of peeling at the bottom portion of the via hole of each of the printed wiring boards No. 1 to No. 5, the proportion of printed wiring boards in which peeling at the bottom portion of the via hole was observed among one hundred printed wiring boards of each test No. was calculated in the following three grades. From the evaluation results, those evaluated as A and B were determined to be acceptable.

A: Peeling rate: 0% or greater and less than 1%
B: Peeling rate: 1% or greater and less than 2%
C: Peeling rate of 2% or greater Table 1 shows the evaluation results.

palladium per unit area of the surface of copper foil was 0.03 µg/cm$^2$ to 0.15 µg/cm$^2$, the effect of suppressing the erroneous detection in the appearance inspection by the automated optical inspection system and the peeling of the bottom portion of the via hole was good.

On the other hand, in Test No. 2 in which the stacking amount of palladium per unit area of the surface of copper foil was less than 0.03 µg/cm$^2$, the effect of suppressing erroneous detection in the appearance inspection by the automated optical inspection system was poor. In Test No. 3 in which the stacking amount of palladium per unit area of the surface of copper foil was more than 0.15 µg/cm$^2$, the effect of suppressing peeling at the bottom portion of the via hole was poor.

DESCRIPTION OF SYMBOLS 1 base layer
2 first conductive layer
3 second conductive layer
4 via hole
5 connection hole
7 electrolytic copper plating layer
8 electroless copper plating layer
10 stacked body for via hole
20 printed wiring board

The invention claimed is:
1. A printed wiring board comprising:
a base layer having insulating properties;
a first conductive layer directly or indirectly stacked on a front surface of the base layer, and including a copper foil;
a second conductive layer directly or indirectly stacked on a back surface of the base layer, and including a copper foil;
a stacked body for a via hole, the stacked body being stacked on an inner periphery and a bottom of a connection hole that extends through the first conductive layer and the base layer in a thickness direction, and being configured to electrically connect the first conductive layer and the second conductive layer to each other,
wherein the stacked body for the via hole has an electroless copper plating layer that is stacked on the inner

TABLE 1

| | Copper foil of conductive layer | | | | Appearance defect resulting from an automated optical inspection system | | Peeling of a bottom of via hole | |
|---|---|---|---|---|---|---|---|---|
| Test No. | A proportion (%) of an area of a crystal grain having a (100) plane orientation | Average crystal grain size (µm) | Form of catalyst | Stacking amount of palladium on copper foil (µg/cm$^2$) | Erroneous detection rate (%) | Determination | Occurrence rate (%) | Determination |
| No. 1 | 90 | 50 | Ion | 0.041 | 0 | A | 0 | A |
| No. 2 | 90 | 50 | Ion | 0.027 | 18 | C | 0 | A |
| No. 3 | 90 | 50 | Ion | 0.155 | 0 | A | 2 | C |
| No. 4 | 60 | 13 | Ion | 0.042 | 2 | A | 0 | A |
| No. 5 | 40 | 15 | Ion | 0.041 | 6 | B | 0 | A |

As shown in Table 1, in Tests No. 1 and No. 4 to No. 5 in which the average crystal grain size of copper of the copper foil was 10 µm or greater and the stacking amount of periphery and the bottom of the connection hole, and an electrolytic copper plating layer that is stacked on a surface of the electroless copper plating layer, wherein each copper foil contains a copper crystal grain oriented in a (100) plane orientation, and an average crystal grain size of copper of each copper foil is 10 μm or greater, wherein the electroless copper plating layer includes palladium, and wherein a stacking amount of the palladium per unit area of a surface of each copper foil is 0.03 μg/cm$^2$ to 0.15 μg/cm$^2$, the surface of each copper foil facing the electroless copper plating layer.

2. The printed wiring board according to claim 1, wherein a proportion of an area of the copper crystal grain oriented in the (100) plane orientation existing in the surface of each copper foil with respect to an area of the surface of each copper foil is 50% or greater.

3. The printed wiring board according to claim 1, wherein the stacking amount of the palladium per unit area of the surface of each copper foil is 0.05 μg/cm$^2$ to 0.10 μg/cm$^2$.

4. The printed wiring board according to claim 3, wherein a proportion of an area of the copper crystal grain oriented in the (100) plane orientation existing in the surface of each copper foil with respect to an area of the surface of each copper foil is 50% or greater.

5. The printed wiring board according to claim 1, wherein an average thickness of the electroless copper plating layer is 0.05 μm to 1.0 μm.

* * * * *